(12) United States Patent
Su et al.

(10) Patent No.: US 10,096,553 B2
(45) Date of Patent: Oct. 9, 2018

(54) METAL PAD FOR LASER MARKING

(71) Applicant: Taiwan Semiconductor Manufacturing Company, Ltd., Hsin-Chu (TW)

(72) Inventors: An-Jhih Su, Taoyuan (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 77 days.

(21) Appl. No.: 15/407,043

(22) Filed: Jan. 16, 2017

(65) Prior Publication Data
US 2017/0125355 A1  May 4, 2017

Related U.S. Application Data

(62) Division of application No. 14/486,353, filed on Sep. 15, 2014, now Pat. No. 9,589,900.

(Continued)

(51) Int. Cl.
*H01L 23/544* (2006.01)
*H01L 23/495* (2006.01)
(Continued)

(52) U.S. Cl.
CPC ........ *H01L 23/544* (2013.01); *H01L 21/4825* (2013.01); *H01L 21/4842* (2013.01); *H01L 21/563* (2013.01); *H01L 23/3121* (2013.01); *H01L 23/3128* (2013.01); *H01L 23/3677* (2013.01); *H01L 23/49503* (2013.01); *H01L 23/49524* (2013.01); *H01L 23/49527* (2013.01); *H01L 23/49816* (2013.01); *H01L 23/49827* (2013.01); *H01L 23/5389* (2013.01); *H01L 25/065* (2013.01); *H01L 25/0657* (2013.01);
(Continued)

(58) Field of Classification Search
None
See application file for complete search history.

(56) References Cited

U.S. PATENT DOCUMENTS 6,121,067 A * 9/2000 Canella .................. H01L 21/56
257/E21.502
6,420,790 B1 * 7/2002 Koizumi ............. H01L 23/3121
257/787

(Continued)

FOREIGN PATENT DOCUMENTS

CN   100468714 C   3/2009
CN   100543953 C   9/2009
(Continued)

*Primary Examiner* — Andres Munoz
(74) *Attorney, Agent, or Firm* — Slater Matsil, LLP

(57) ABSTRACT

A package includes a device die, a molding material molding the device die therein, and a plurality of redistribution lines overlying the device die and the molding material. A laser mark pad is coplanar with one of the plurality of redistribution lines, wherein the laser mark pad and the one of the plurality of redistribution layers are formed of the same conductive material. A polymer layer is over the laser mark pad and the plurality of redistribution lines. A tape is attached over the polymer layer. A laser mark penetrates through the tape and the polymer layer. The laser mark extends to a top surface of the laser mark pad.

20 Claims, 12 Drawing Sheets

Related U.S. Application Data

(60) Provisional application No. 62/005,692, filed on May 30, 2014.

(51) Int. Cl.
  *H01L 23/31* (2006.01)
  *H01L 21/56* (2006.01)
  *H01L 21/48* (2006.01)
  *H01L 25/065* (2006.01)
  *H01L 23/367* (2006.01)
  *H01L 23/498* (2006.01)
  *H01L 23/538* (2006.01)
  *H01L 25/10* (2006.01)

(52) U.S. Cl.
  CPC .. *H01L 25/105* (2013.01); *H01L 2223/54406* (2013.01); *H01L 2223/54433* (2013.01); *H01L 2223/54486* (2013.01); *H01L 2224/32145* (2013.01); *H01L 2224/48091* (2013.01); *H01L 2224/73265* (2013.01); *H01L 2225/0651* (2013.01); *H01L 2225/0652* (2013.01); *H01L 2225/06548* (2013.01); *H01L 2924/181* (2013.01)

(56) References Cited

U.S. PATENT DOCUMENTS

| | | | |
|---|---|---|---|
| 6,423,908 B1 | 7/2002 | Liu | |
| 6,680,220 B2 * | 1/2004 | Minamio | H01L 21/561 257/E23.069 |
| 7,053,495 B2 | 5/2006 | Tsuura | |
| 7,795,717 B2 | 9/2010 | Goller | |
| 8,097,965 B2 * | 1/2012 | Takata | H01L 21/561 257/787 |
| 8,110,923 B2 * | 2/2012 | Watanabe | H01L 23/544 257/739 |
| 8,242,603 B2 * | 8/2012 | Check | H01L 23/544 257/773 |
| 8,563,403 B1 | 10/2013 | Farooq et al. | |
| 9,000,584 B2 | 4/2015 | Lin et al. | |
| 9,385,102 B2 | 7/2016 | Lin et al. | |
| 9,508,696 B2 * | 11/2016 | Chen | H01L 25/0657 |
| 9,721,933 B2 * | 8/2017 | Chen | H01L 25/105 |
| 2002/0048951 A1 | 4/2002 | Jeong et al. | |
| 2003/0015342 A1 | 1/2003 | Sakamoto et al. | |
| 2004/0201097 A1 | 10/2004 | Ohsumi | |
| 2005/0104224 A1 | 5/2005 | Huang et al. | |
| 2005/0161837 A1 | 7/2005 | Matsui | |
| 2006/0202359 A1 | 9/2006 | Chen | |
| 2007/0164432 A1 | 7/2007 | Wakisaka et al. | |
| 2007/0220742 A1 * | 9/2007 | Lo | H01R 13/465 29/825 |
| 2008/0284048 A1 | 11/2008 | Kim et al. | |
| 2008/0316714 A1 | 12/2008 | Eichelberger et al. | |
| 2009/0045488 A1 | 2/2009 | Chang et al. | |
| 2009/0236739 A1 * | 9/2009 | Chen | B23K 1/0016 257/737 |
| 2009/0302486 A1 | 12/2009 | Terashima et al. | |
| 2010/0078655 A1 | 4/2010 | Yang | |
| 2010/0144101 A1 | 6/2010 | Chow et al. | |
| 2010/0187671 A1 | 7/2010 | Lin et al. | |
| 2010/0233831 A1 | 9/2010 | Pohl et al. | |
| 2010/0283138 A1 | 11/2010 | Chen et al. | |
| 2010/0301474 A1 | 12/2010 | Yang | |
| 2011/0018124 A1 | 1/2011 | Yang et al. | |
| 2011/0084382 A1 | 4/2011 | Chen et al. | |
| 2011/0147911 A1 | 6/2011 | Kohl et al. | |
| 2011/0278736 A1 | 11/2011 | Lin et al. | |
| 2011/0291249 A1 | 12/2011 | Chi et al. | |
| 2012/0056315 A1 | 3/2012 | Chang et al. | |
| 2012/0217645 A1 | 8/2012 | Pagaila | |
| 2012/0247291 A1 | 10/2012 | Kawada | |
| 2013/0250298 A1 | 9/2013 | Komuta et al. | |
| 2014/0057394 A1 | 2/2014 | Ramasamy et al. | |
| 2014/0077366 A1 | 3/2014 | Kim et al. | |
| 2014/0110858 A1 | 4/2014 | Beer et al. | |
| 2014/0175657 A1 * | 6/2014 | Oka | H01L 23/5389 257/773 |
| 2014/0264846 A1 | 9/2014 | Chen et al. | |
| 2014/0374922 A1 * | 12/2014 | Huang | H01L 23/3128 257/777 |
| 2015/0294939 A1 * | 10/2015 | Yu | H01L 25/50 257/529 |

FOREIGN PATENT DOCUMENTS

| | | |
|---|---|---|
| CN | 101740551 A | 6/2010 |
| CN | 102347251 B | 5/2013 |
| CN | 103187388 A | 7/2013 |
| CN | 103715104 A | 4/2014 |
| DE | 10320646 A1 | 9/2004 |
| JP | 3670634 B2 | 7/2005 |
| KR | 20000002908 A | 1/2000 |
| KR | 20070051038 A | 5/2007 |
| KR | 100878933 B1 | 1/2009 |
| KR | 20120024350 A | 3/2012 |

* cited by examiner

METAL PAD FOR LASER MARKING

PRIORITY CLAIM AND CROSS-REFERENCE

This application is a divisional of U.S. application Ser. No. 14/486,353, filed Sep. 15, 2014, and entitled "Metal Pad for Laser Making", which application claims the benefit of the following provisionally filed U.S. Patent application: Application Ser. No. 62/005,692, filed May 30, 2014, and entitled "Metal pad for Laser Marking," and is related to U.S. patent application Ser. No. 14/192,341, filed on Feb. 27, 2014, entitled "Laser Marking in Packages," which applications are hereby incorporated herein by reference.

BACKGROUND

In the packaging of integrated circuits, there are various types of packaging methods and structures. For example, in a conventional Package-on-Package (POP) process, a top package is bonded to a bottom package. The top package and the bottom package may also have device dies packaged therein. By adopting the PoP process, the integration level of the packages is increased.

In an existing PoP process, the bottom package is formed first, which includes a device die bonded to a package substrate. A molding compound is molded on the package substrate, wherein the device die is molded in the molding compound. The package substrate further includes solder balls formed thereon, wherein the solder balls and the device die are on a same side of the package substrate. The solder balls are used for connecting the top package to the bottom package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
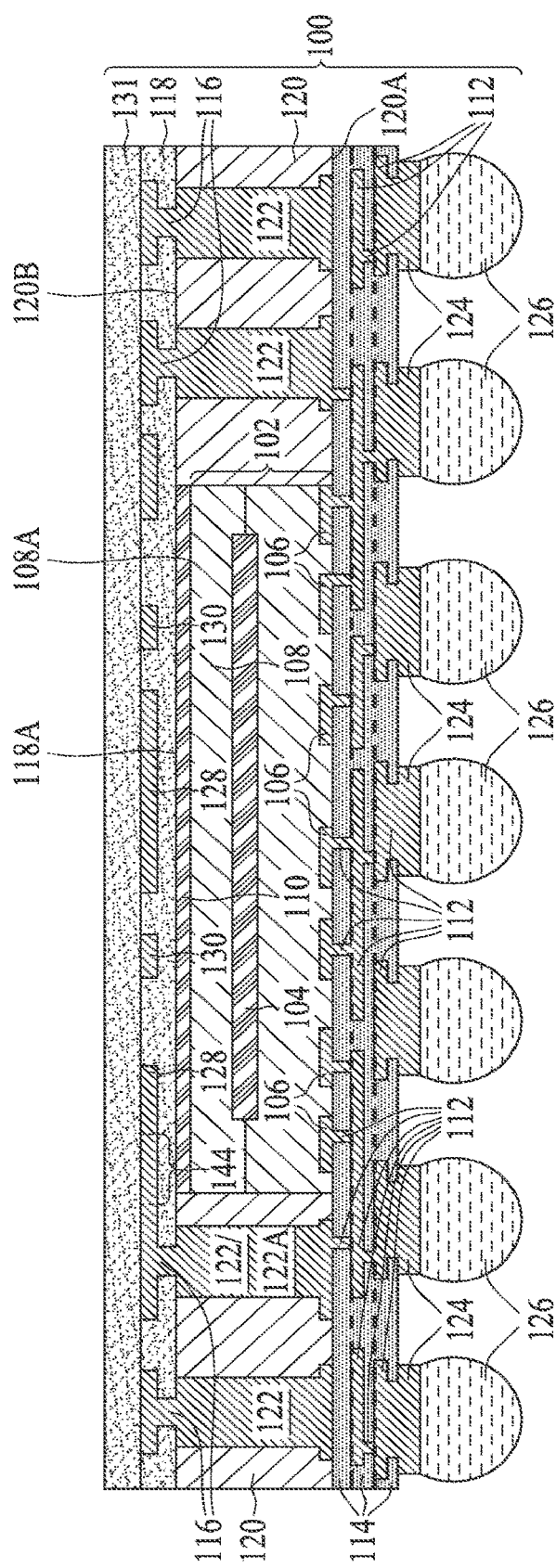
FIGS. 1 through 7 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming laser marks in the package are provided in accordance with various exemplary embodiments. The variations of the embodiments are discussed. Throughout the various views and illustrative embodiments, like reference numbers are used to designate like elements.

FIG. 1 illustrates a cross-sectional view of package 100. In accordance with some embodiments of the present disclosure, package 100 includes device die 102, with the front side of device die 102 facing down and bonded to Redistribution Lines (RDLs) 112. In alternative embodiments, package 100 includes more than one device die. Device die 102 may include semiconductor substrate 108 and integrated circuit devices 104 (such as active devices, which may include Metal Oxide Semiconductor (MOS) transistors or diodes, for example) on the front surface (the surface facing down) of semiconductor substrate 108. Device die 102 may be a logic die such as a Central Processing Unit (CPU) die, a Graphic Processing Unit (GPU) die, a mobile application die, or the like. Throughout the description of the present disclosure, the side of device die 102 facing down in FIG. 1 is referred to as the front side of device die 102, and the side of device die 102 facing up in FIG. 1 is referred to as the backside of device die 102. The back surface 108A of semiconductor substrate 108 is also the back surface of device die 102.

Device die 102 is molded in molding material 120, which encircles device die 102. Molding material 120 may be a molding compound, a molding underfill, a resin, or the like. The bottom surface 120A of molding material 120 may be level with the bottom end of device die 102. The top surface 120B of molding material 120 may be level with or higher than back surface 108A of semiconductor substrate 108. In accordance with some embodiments of the present disclosure, back surface 108A of semiconductor substrate 108 is overlapped by, and in contact with, die-attach film 110, which is a dielectric film adhering device die 102 to the overlying dielectric layer 118. Device die 102 further includes metal pillars/pads 106 (which may include copper pillars, for example) in contact with, and bonded to, RDLs 112. Metal pillars 106 may be embedded in a surface dielectric layer (not marked) of device die 102.

Package 100 includes RDLs 112 underlying device die 102 and RDLs 116 overlying device dies 102. RDLs 112 are also referred to as front-side RDLs since they are on the front side of device die 102. RDLs 116 are also referred to as backside RDLs since they are on the backside of device die 102. Front-side RDLs 112 are formed in one or a plurality of dielectric layers 114, and backside RDLs 116 are formed in one or a plurality of dielectric layers 118. Although FIG. 1 illustrates that there is one layer of backside RDLs 116 and a plurality of layers of front-side RDLs 112, it is appreciated that the numbers of layers constructing RDLs 112 and 116 are determined by routing requirements and may be different from what is illustrated. RDLs 112 and 116 may be formed of copper, aluminum, nickel, titanium, tantalum, alloys thereof, and/or multi-layers thereof.

In accordance with some embodiments of the present disclosure, dielectric layers 114 and 118 are formed of organic materials such as polymers, which may further include polybenzoxazole (PBO), benzocyclobutene (BCB), polyimide, solder mask, or the like. In alternative embodiments, dielectric layers 114 and 118 are formed of inorganic material such as silicon oxide, silicon nitride, silicon oxynitride, or the like. Furthermore, some of dielectric layers 114 and 118 may be a composite layer including a plurality of sub-layers formed of different materials. For example, one exemplary dielectric layer 114 or 118 may include a silicon oxide layer and a silicon nitride layer.

In accordance with some embodiments of the present disclosure, the formation of each layer of RDLs 116 and dielectric layers 118 includes the forming of a blanket seed layer (not shown) using Physical Vapor Deposition (PVD), the forming and patterning of a photo resist (not shown) to cover some portions of the blanket seed layer, the plating of the RDLs in the openings in the photo resist, and then the removal of the photo resist and etching of the portions of the seed layer previously covered by the removed photo resist.

Through-vias 122 are formed to penetrate through molding material 120. In accordance with some embodiments of the present disclosure, through-vias 122 have top surfaces level with the top surface 120B of molding material 120 and bottom surfaces level with the bottom surface 120A of molding material 120. Through-vias 122 electrically connect front-side RDLs 112 to backside RDLs 116. Through-vias 122 may also be in physical contact with front-side RDLs 112 and backside RDLs 116. Through-vias 122 may be formed by forming a patterned mask (not shown) with openings therein and plating through-vias 122 in the openings in the patterned mask. Through-vias 122 may comprise copper, aluminum, titanium, nickel, palladium, or alloys thereof.

Through-vias 122 may be formed close to the periphery of package 100, as shown in FIGS. 8 through 12, although through-vias 122 may also be formed in any other locations of package 100. Through-vias 122 may be aligned to a ring that encircles laser mark pad 128 in accordance with some embodiments of the present disclosure.

Electrical connectors 124, which are formed of non-solder metallic materials, are formed at the bottom surface of package 100. In accordance with some embodiments of the present disclosure, electrical connectors 124 include Under-Bump Metallurgies (UBMs) or metal pads. In alternative embodiments, electrical connectors 124 include metal pillars such as copper pillars. Throughout the description, electrical connectors 124 are metal pads 124, although they may have other forms. Metal pads 124 may comprise copper, aluminum, titanium, nickel, palladium, gold, or multi-layers thereof. In accordance with some embodiments of the present disclosure, as shown in FIG. 1, the bottom surfaces of metal pads 124 protrude beyond the bottom surface of the bottom dielectric layer 114. In alternative embodiments, the bottom surfaces of metal pads 124 are coplanar with the bottom surface of the bottom dielectric layer 114. Solder regions 126 may be attached to the bottom surfaces of metal pads 124.

On the backside of device die 102, conductive features such as RDLs 116 (including metal traces, metal pads, and metal vias) are formed. In accordance with some embodiments of the present disclosure, there is a plurality of layers of RDLs 116 interconnected through a plurality of vias. In accordance with alternative embodiments, there is a single layer of RDLs 116.

Further referring to FIG. 1, metal pad 128 is formed. Metal pad 128 is referred to as laser mark pad hereinafter since it is used for forming laser marks. In accordance with some embodiments of the present disclosure, laser mark pad 128 is formed in the top layer of RDLs 116. In accordance with alternative embodiments, laser mark pad 128 is formed in an RDL layer other than the top layer. Laser mark pad 128 may be electrically floating. Alternatively, laser mark pad 128 is electrically connected to other conductive features such as RDLs 116 and/or through-vias 122 through metal trace 144, which is a part of RDLs 116. For example, laser mark pad 128 may be connected to the electrical ground. Laser mark pad 128 is formed simultaneously with RDLs 116 in the same metal layer.

Figure 8:
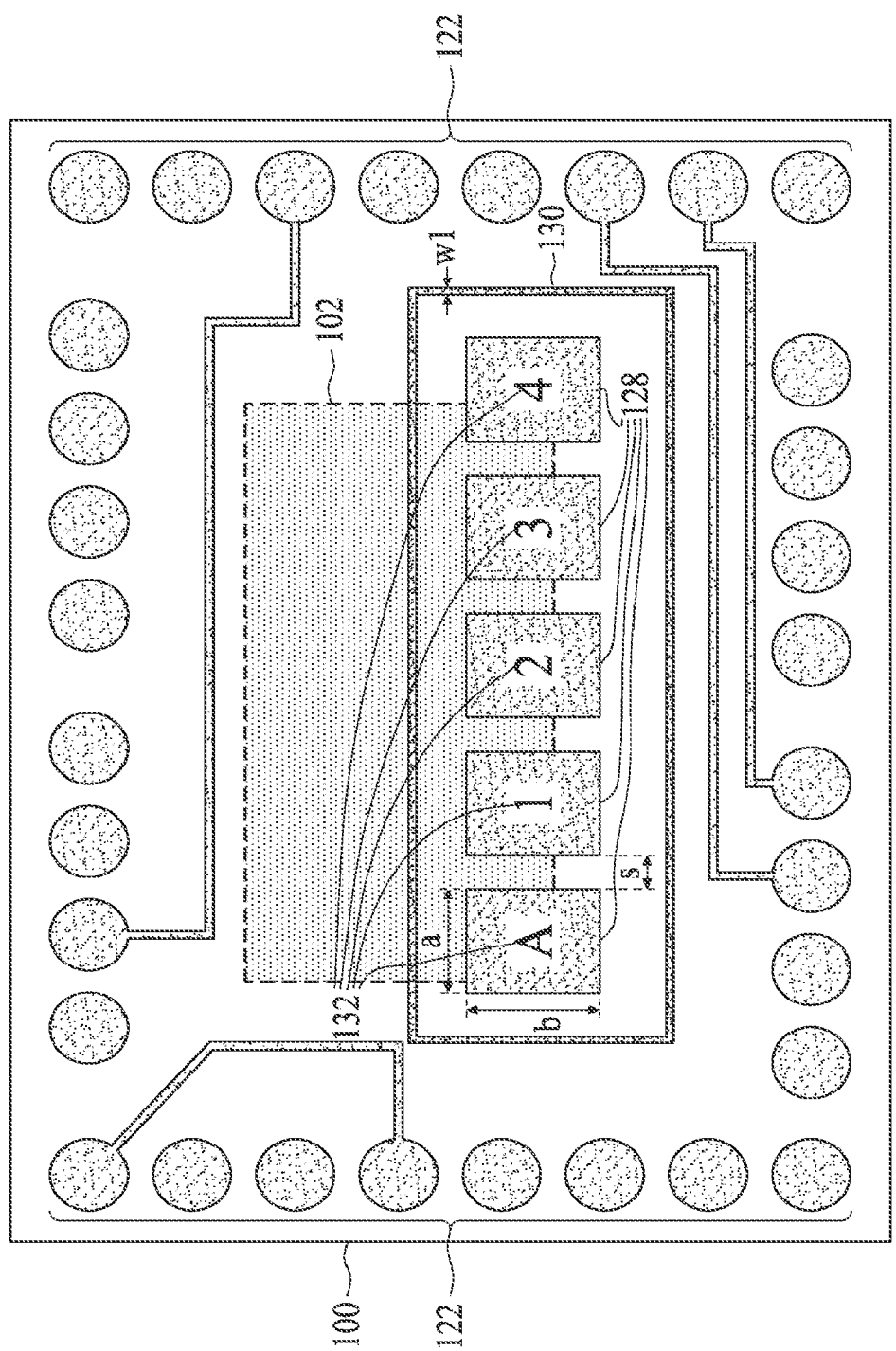
FIG. 8 illustrates the top view of a package in accordance with some embodiments, wherein a plurality of laser mark pads is isolated from each other.

In some exemplary embodiments, seal ring 130 is formed to encircle laser mark pad 128, wherein the exemplary seal ring 130 may be found in FIG. 8. As shown in FIG. 1, seal ring 130 is formed in the same metal layer as laser mark pad 128. In accordance with some embodiments of the present disclosure, seal ring 130 is formed in a single layer of RDLs 116. In alternative embodiments, seal ring 30 extends into a plurality of layers of RDLs 116. Seal ring 130 may be electrically floating and may be fully enclosed by dielectric materials. In alternative embodiments, seal ring 130 is electrically coupled to other conductive features such as RDLs 116 and/or through-vias 122. Seal ring 130 may be formed simultaneously when laser mark pad 128 is formed. Accordingly, seal ring 130, RDLs 116, and laser mark pad 128 may be formed of the same material and have the same composition. Alternatively, no seal ring is formed to encircle laser mark pad 128.

In accordance with some embodiments, the bottom surfaces of laser mark pad 128 and seal ring 130 are higher than the top surface of die-attach film 110 and the top surface 120B of molding material 120. One of dielectric layers 118 (marked as 118A in FIG. 1) is formed underneath laser mark pad 128 and seal ring 130, with the top surface of the respective dielectric layer 118A contacting the bottom surfaces of laser mark pad 128. The bottom surface of dielectric layer 118A may be in contact with the top surface of die attach film 110 and the top surface of molding material 120.

As also shown in FIG. 1, dielectric layer 131 is formed. The bottom of dielectric layer 131 is in contact with the top surface of dielectric layer 118. Furthermore, the bottom surface of dielectric layer 131 is also in contact with the top surfaces of RDLs 116 and laser mark pad 128. In accordance with some exemplary embodiments of the present disclosure, dielectric layer 131 is formed of a polymer, and hence is referred to as polymer layer 131 throughout the description. It is appreciated that dielectric layer 131 may also be formed of a non-polymer material. The exemplary candidate materials for forming polymer layer 131 include, but are not limited to, PBO, BCB, polyimide, and the like.

Figure 2:
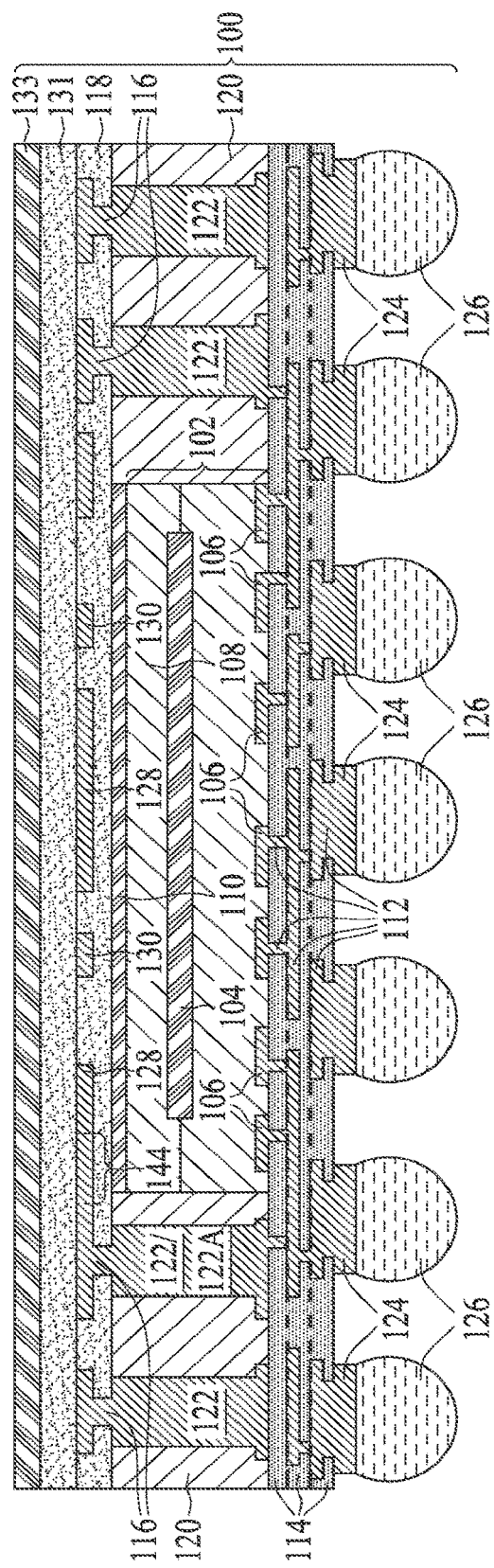

Referring to FIG. 2, tape 133 is laminated onto polymer layer 131 and may be adhered to polymer layer 131 through heat curing. Tape 133 may provide protection and reinforcement to the underlying package structure. Tape 133 also blocks light from penetrating into the underlying package structure, reducing its adverse effects. Tape 133 also helps reduce chipping during the subsequent dicing process of the package. In accordance with some embodiments, tape 133 and polymer layer 131 may be formed of different materials.

Figure 3:
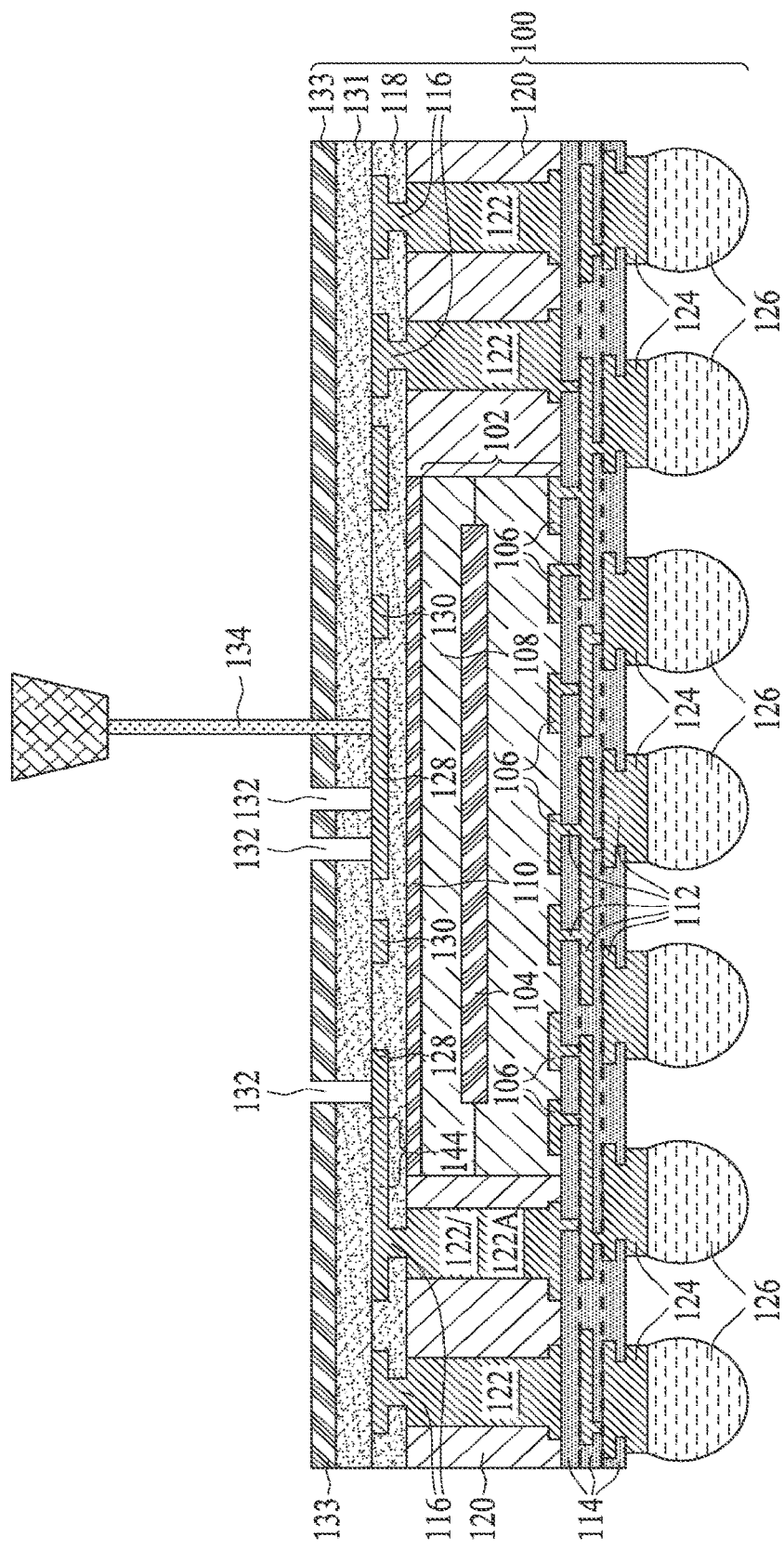

Referring to FIG. 3, a laser marking is performed to form laser marks 132 in tape 133 and dielectric layer 131, wherein laser marks 132 include the trenches formed in tape 133 and dielectric layer 131. The laser marking is performed using laser beam 134, which burns and removes parts of tape 133 and dielectric layer 131. In accordance with some embodiments of the present disclosure, the burned parts of tape 133 and dielectric layer 131 overlap laser mark pad 128. Laser mark pad 128 acts as a protection layer, wherein laser beam 134 is not able to penetrate through laser mark pad 128 to damage the layers and devices underneath laser mark pad 128. Hence, laser mark pad 128 has the function of preventing laser beam 134 from reaching the underlying device die 102 and the underlying RDLs 116, if any.

Laser marks 132 may include letters, digits, figures, or any other symbols that can be used for identification purpose. For example, FIG. 8 illustrates some exemplary laser marks 134 that include letters and digits. Laser marks 132 may be used to identify the product, the manufacturing sequence, the lot number of the respective package, or any other information that is used to track the respective package. After the laser marking, some portions of laser mark pad 128 are exposed through the trenches that form laser marks 132.

Figure 4:
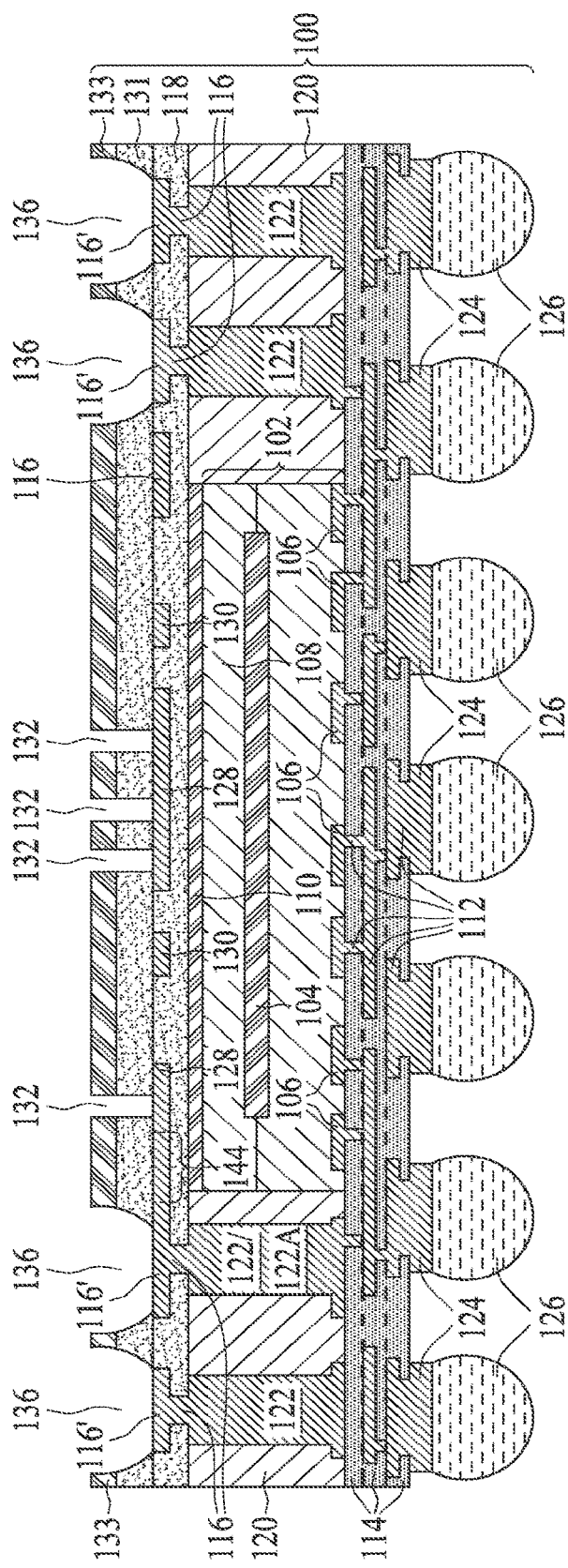

FIG. 4 illustrates the removal of some parts of tape 133 and dielectric layer 131 to expose metal pads 116', which may be parts of RDLs 116. As a result, openings 136 are formed in dielectric layer 131 and tape 133. In accordance with some exemplary embodiments, the formation of openings 136 is achieved through burning tape 133 and dielectric layers 118 using a laser beam. In accordance with alternative embodiments, openings 136 are formed through a photolithography process, in which tape 133 and dielectric layer 131 are etched. In the resulting structure, the bottom surfaces of openings 136 and laser marks 132 may be substantially coplanar, that is, at the same level as the top surfaces of laser mark pad 128 and RDL pads 116'.

Figure 5:
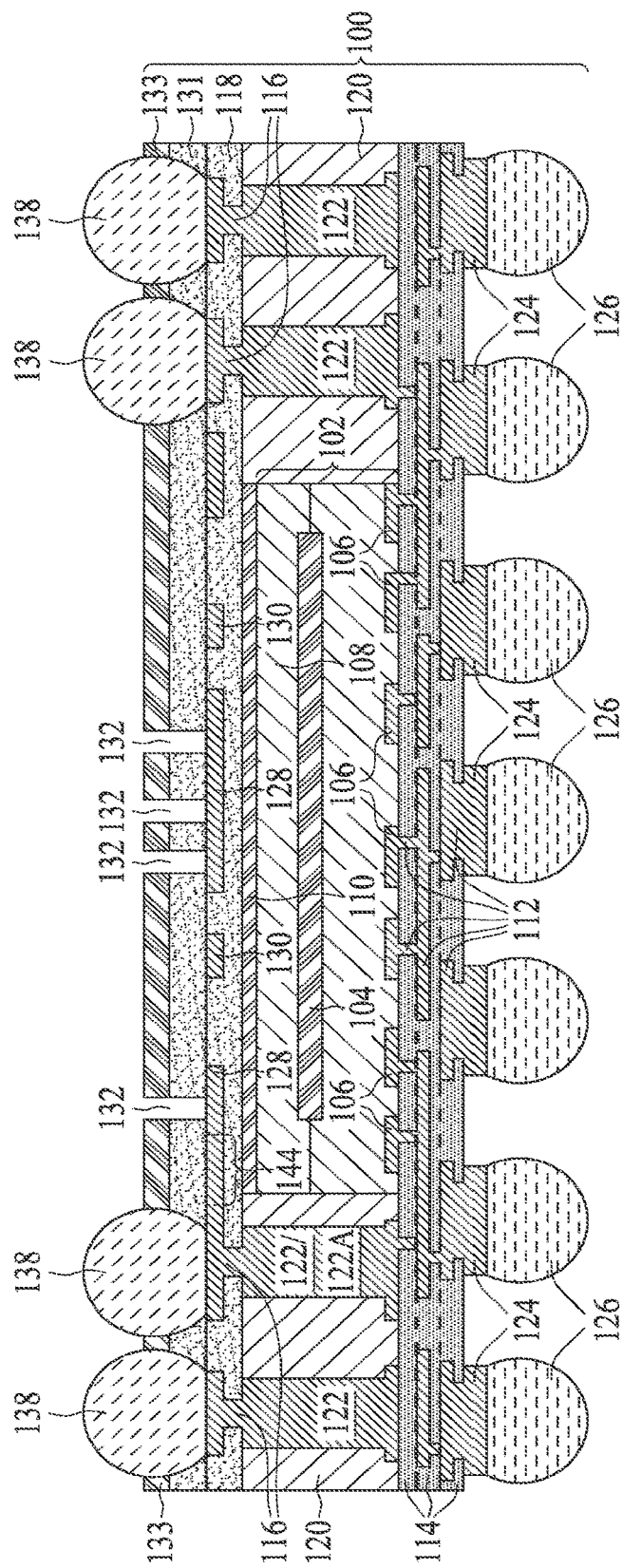

FIG. 5 illustrates the formation of solder regions 138. In accordance with some embodiments of the present disclosure, a ball placement step is performed to drop solder balls in openings 136 (FIG. 3), followed by a reflow process to reflow the solder balls to form solder regions 138. Solder regions 138 include portions contacting the top surfaces of RDL pads 116' and may also include some portions outside of openings 136. In alternative embodiments, the solder region formation step is skipped. Rather, the solder used for forming solder regions 138' (FIG. 6) is provided by the solder regions attached to package component 200, as shown in FIG. 6.

Figure 6:
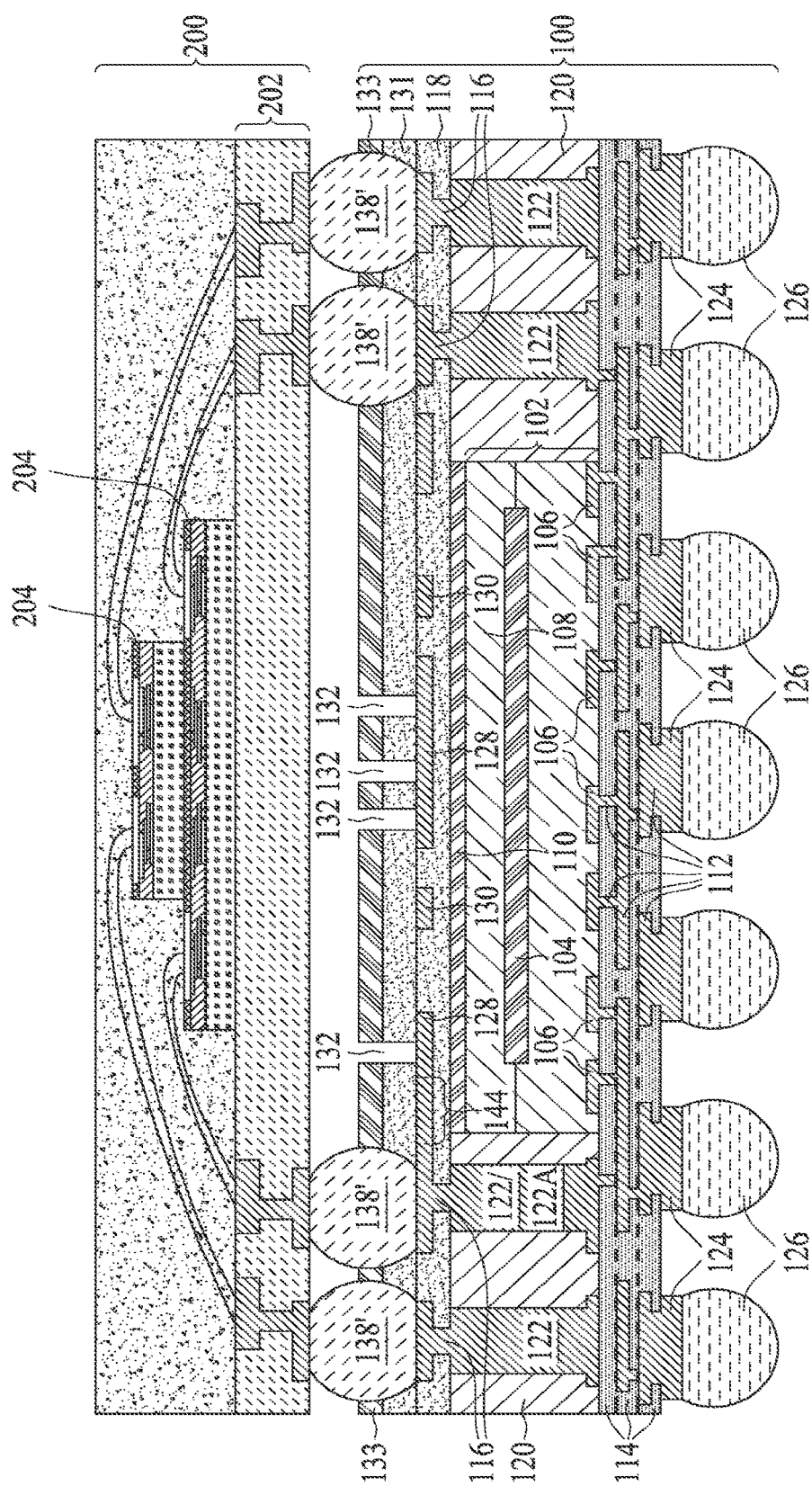

FIG. 6 illustrates the bonding of package 200 with package 100. In accordance with some embodiments of the present disclosure, package 200 includes package substrate 202 and device die(s) 204, which are bonded to package substrate 202. The bonding of device dies 204 to package substrate 202 may be achieved through wire bonding, flip-chip bonding, or the like. In accordance with some exemplary embodiments, device dies 204 include memory dies such as Static Random Access Memory (SRAM) dies, Dynamic Random Access Memory (DRAM) dies, or the like.

In the bonding process, the solder regions 138 as shown in FIG. 5 are reflowed to form solder regions 138' as in FIG. 6. After the bonding process, there is a gap between package 200 and package 100, and laser marks 132 are exposed to the gap.

Figure 7:
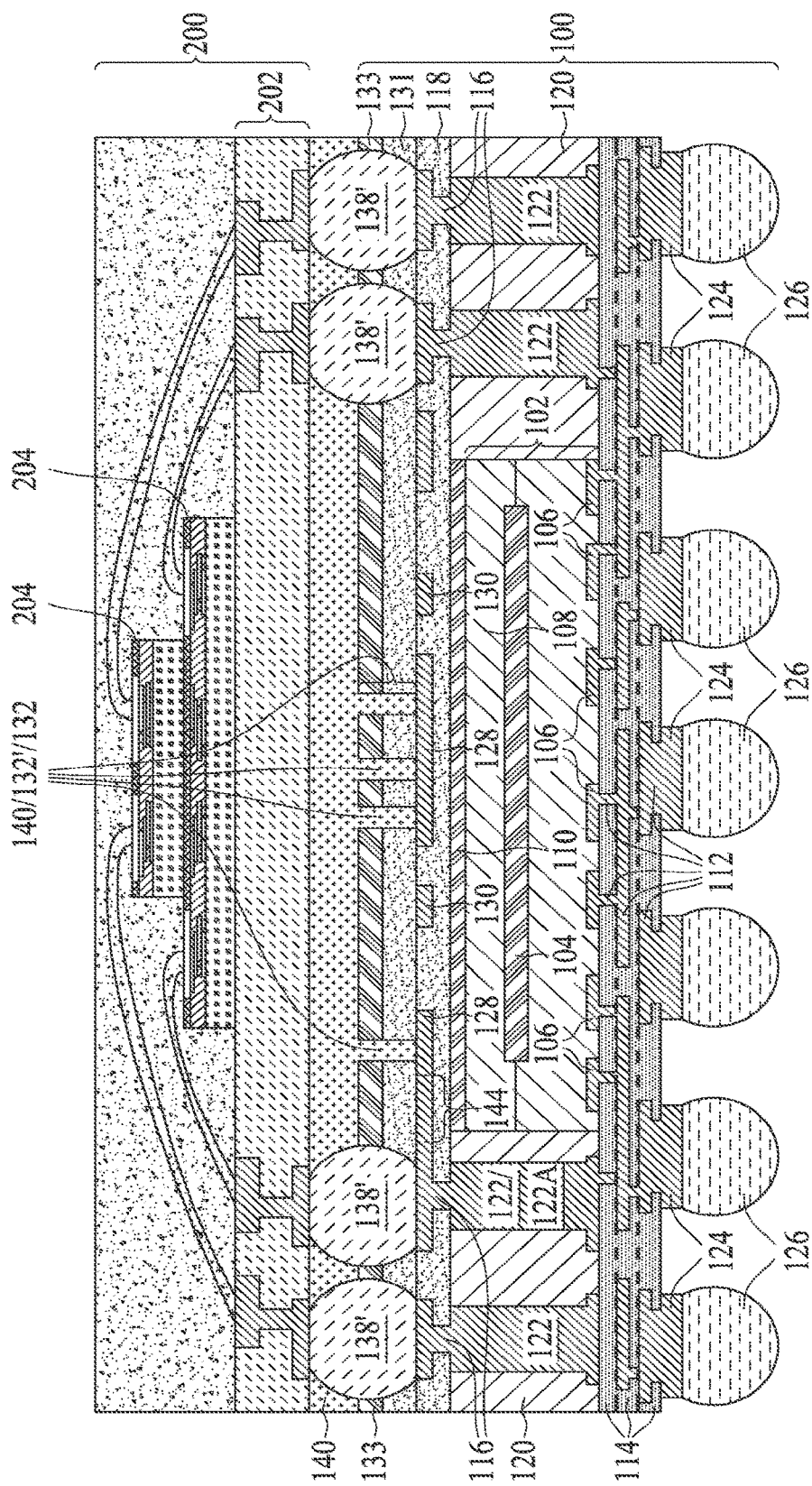

Referring to FIG. 7, in accordance with some embodiments of the present disclosure, after the bonding of package 200, underfill 140 is filled into the gap between package 100 and package 200. In these embodiments, the trenches of laser mark 132 (FIG. 4) are also filled with underfill 140. Accordingly, the portions of underfill 140 in the trenches of the laser mark 132 are alternatively referred to as laser marks 132'. Laser marks 132' may extend from the top surface of tape 133 to the top surface of laser mark pad 128. Furthermore, laser marks 132' may be in physical contact with the top surface of laser mark pad 128. In alternative embodiments, no underfill is filled into the gap between packages 100 and 200, and hence in the final package (for example, at the time the package is used and powered on), laser marks 132 remain trenches (refer to FIG. 6). In these embodiments, some portions of laser mark pad 128 may be exposed to air through laser marks 132.

In the package as shown in FIG. 7, laser mark pad 128 may be fully enclosed by, and in contact with, dielectric materials including dielectric layers 118 and 131 as well as underfill 140.

FIG. 8 illustrates a top view of package 100 in accordance with some embodiments. As shown in FIG. 8, laser marks 132 may overlap laser mark pad 128, wherein all laser marks 132 are formed on laser mark pad 128. Seal ring 130 is formed in accordance with some embodiments of the present disclosure and forms a ring encircling laser mark pad 128. In some exemplary embodiments, there is a plurality of discrete laser mark pads 128 that are physically separated from each other. The discrete laser mark pads 128 may also be electrically isolated from each other in accordance with some embodiments. The sizes of laser mark pads 128 may be selected depending on the size of package 100 and the desirable sizes of laser marks 132. For example, the length "a" and width "b" of laser mark pads may be in the range of about 1 mm to about 5 mm, and the spacing "S" between neighboring laser mark pads 128 may be greater than about 500 μm. It is appreciated, however, that the values recited throughout the description are merely examples and may be changed to different values.

In accordance with some exemplary embodiments, as shown in FIGS. 7 and 8 in combination, each part of discrete laser mark pads 128 is fully enclosed in dielectric materials, with no surface of the discrete laser mark pads 128 in contact with conductive materials in these exemplary embodiments. For example, the bottom surface and the sidewall surfaces of the discrete laser mark pads 128 are in contact with dielectric layers 118, as shown in FIG. 7. The top surfaces of discrete laser mark pads 128 are in contact with polymer layer 131. Furthermore, some portions of the top surfaces of discrete laser mark pads 128 are in contact with underfill 140 as in the embodiment in FIG. 7, or air as in the embodiment in FIG. 6.

During the laser marking, heat is generated and results in the dielectric layers around laser mark pads 128 being undesirably burned, causing the deformation of dielectric layers 118 and RDLs 116 as well as other reliability problems. Accordingly, it is desirable to quickly dissipate the heat generated in laser mark pads 128 to other regions and features so that the temperature of laser mark pads 128 is limited under the burning/deforming temperature of layers 118, 131, and 133. Seal ring 130 may dissipate heat in some embodiments. To improve the efficiency in heat dissipation, seal ring 130 may have a greater width W1 that is, for example, greater than about 20 μm to provide low thermal resistance so that an overheated portion of seal ring 130 may quickly dissipate the heat to other portions of seal ring 130. In alternative embodiments, no seal ring 130 is formed.

Figure 9:
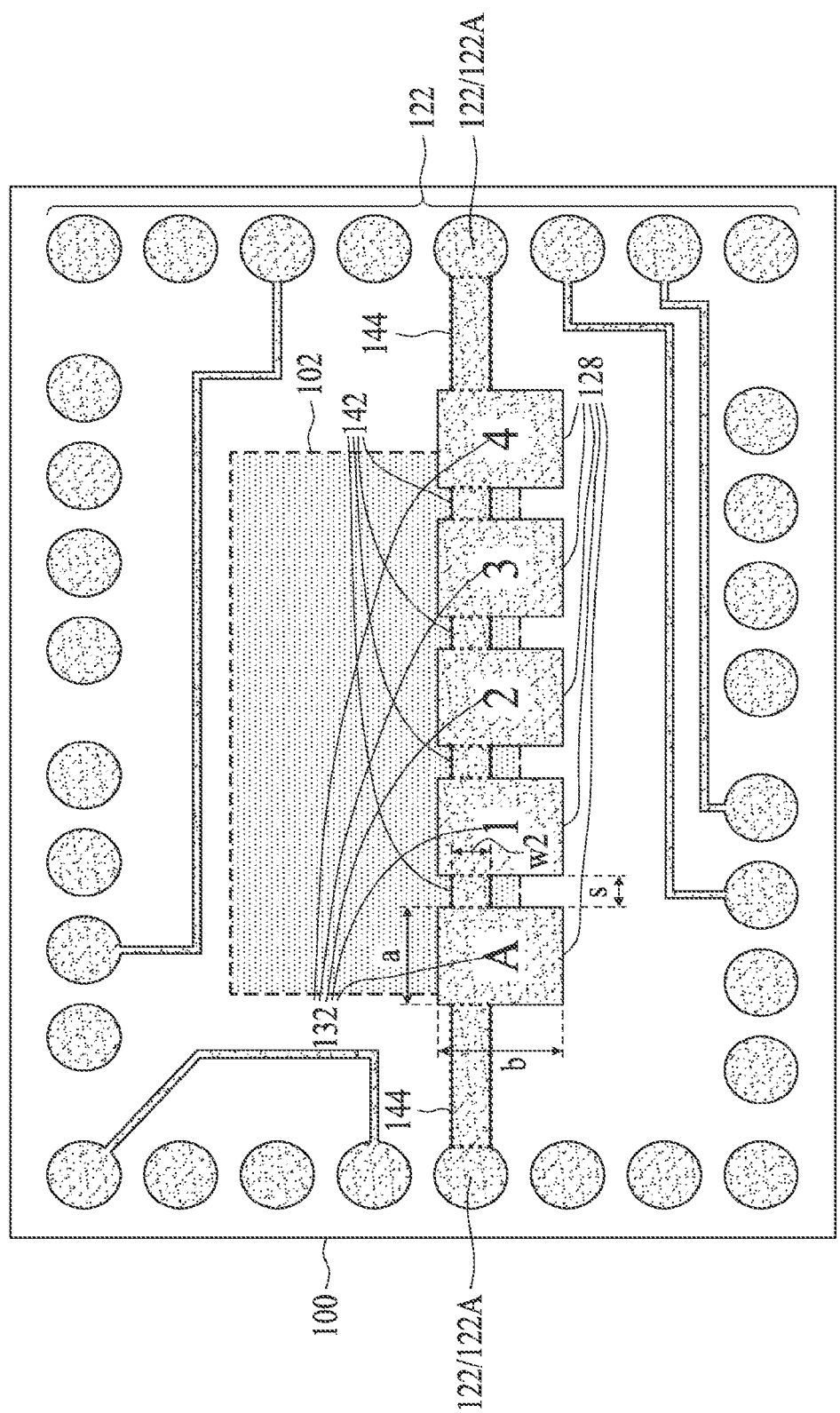
FIG. 9 illustrates the top view of a package in accordance with some embodiments, wherein a laser mark pad is connected to a through-via.

Furthermore, in order to improve the heat-dissipating efficiency, some or all of laser mark pads 128 are interconnected through metal traces 142, as in the embodiments shown in FIG. 9. Accordingly, when laser marking is performed to form laser mark(s) 132 over one of laser mark pads 128, the heat may be dissipated to neighboring laser mark pads 128. In accordance with some exemplary embodiments, width W2 of metal traces 142 is greater than about 20 μm or about 100 μm or more to provide better heat dissipation. Width W2 is further smaller than width b of laser mark pads 128.

In addition to metal traces 142, additional metal traces 144 may be formed to further dissipate heat to nearby features. For example, as shown in FIG. 9, metal traces 144 connect metal pads 128 to some of through-vias 122 (marked as 122A) so that during the laser marking process, through-vias 122A act as heat sinks to help reduce the temperature of laser mark pads 128. The exemplary metal traces 144 may also be found in FIG. 7, which shows that one of laser mark pads 128 is connected to through-via 122A. In accordance with some embodiments, through-via 122A is connected to electrical ground. In alternative embodiments, through-via 122A is a signal via that is used to carry slow-changing signals (with a low frequency that is, for example, lower than about 1 MHz or 1 kHz).

Figure 10:
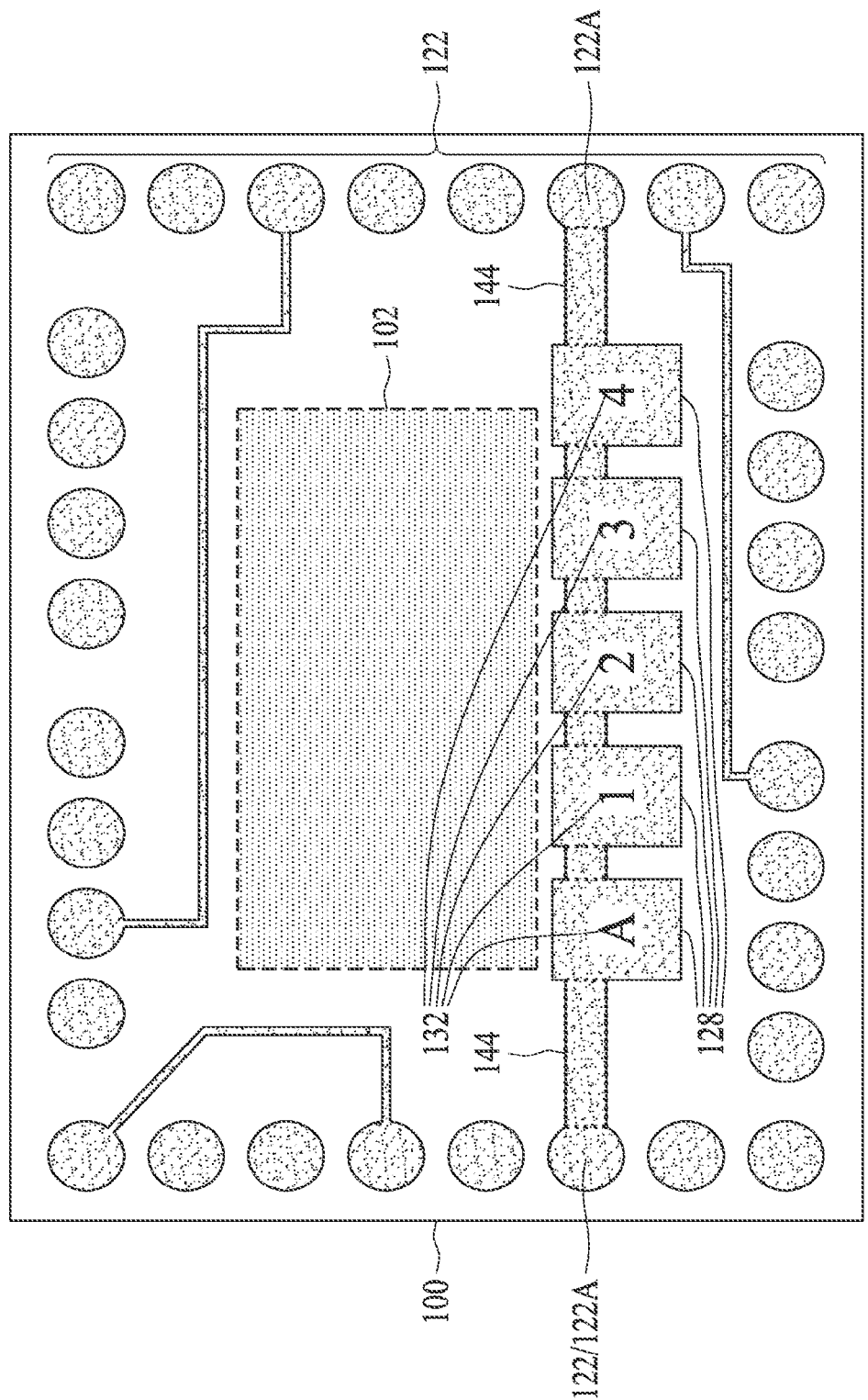
FIG. 10 illustrates the top view of a package in accordance with some embodiments, wherein a laser mark and a respective laser mark pad are misaligned with a device die in the package.

In FIGS. 8 and 9, laser mark pads 128 and laser marks 132 are formed directly over, and overlap, device die 102. In alternative embodiments, as shown in FIG. 10, which also illustrates a top view of package 100, laser mark pads 128 and laser marks 132 are not aligned to device die 102. In these embodiments, the heat dissipated from laser mark pads 128 is less likely to adversely affect device die 102 due to the increased distance between laser mark pads 128 and device die 102.

Figure 11:
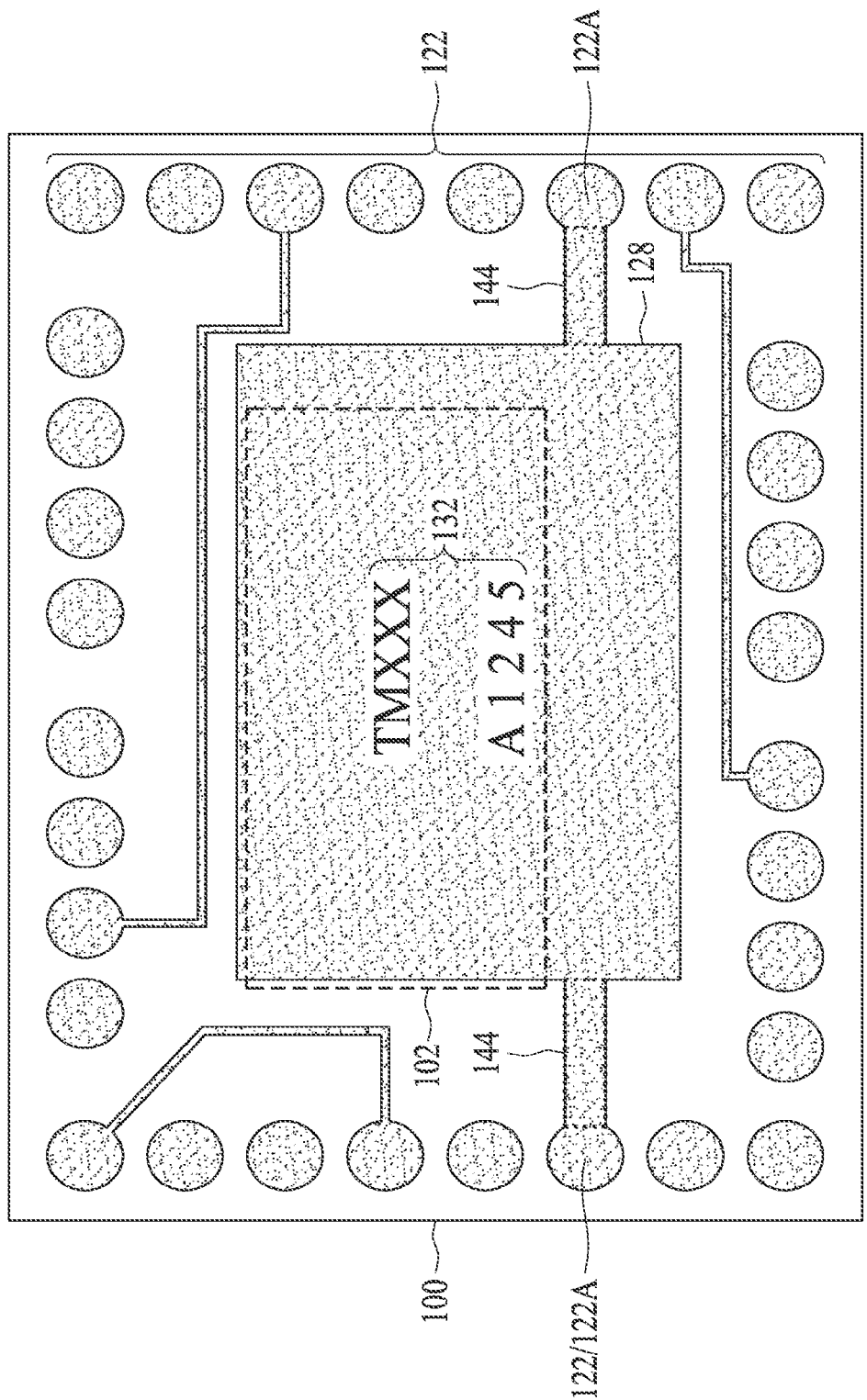
FIG. 11 illustrates the top view of a package in accordance with some embodiments, wherein a plurality of laser marks is formed over a large laser mark pad.
Figure 12:
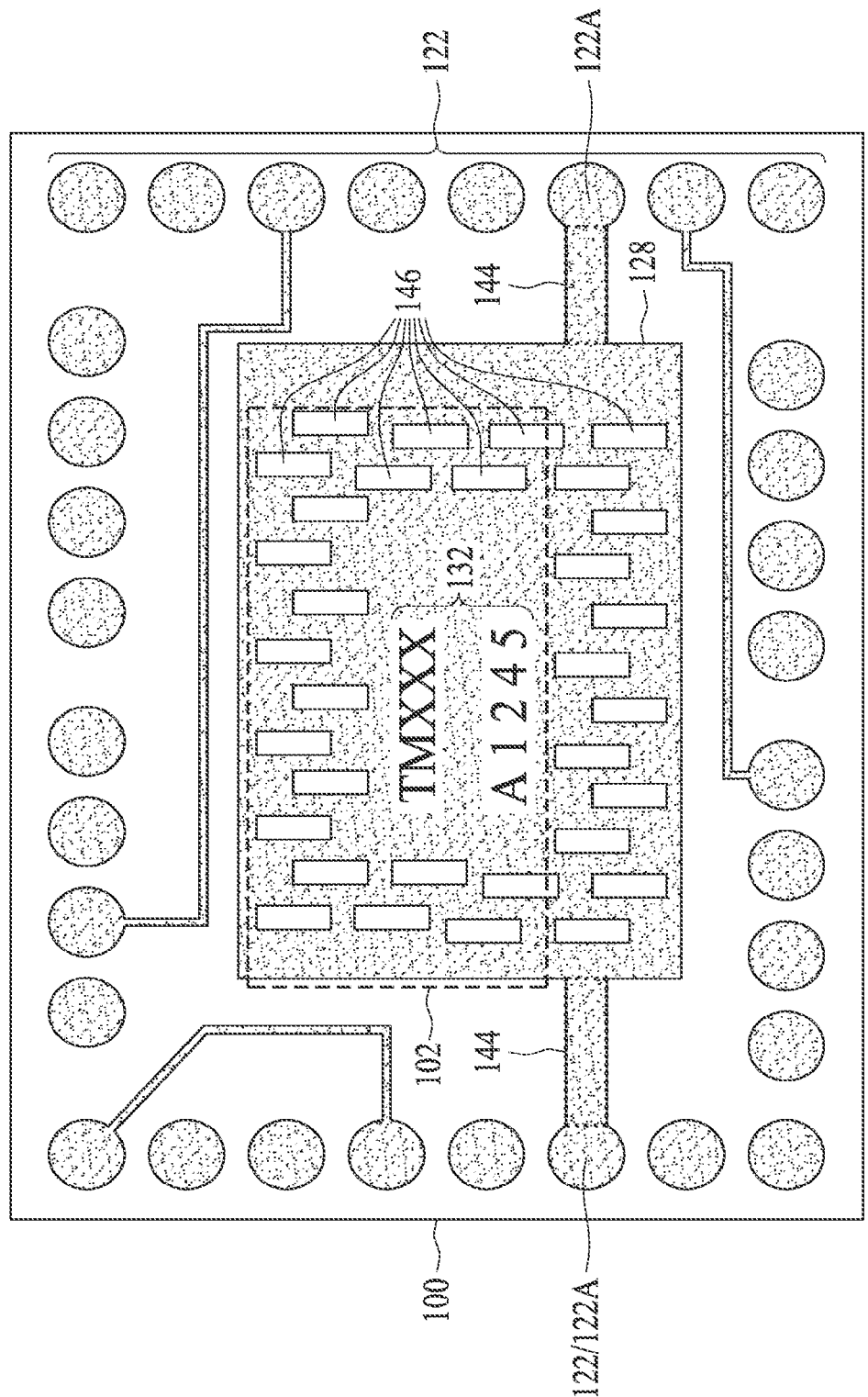
FIG. 12 illustrates the top view of a package in accordance with some embodiments, wherein a large laser mark pad includes a plurality of slots.

FIGS. 11 and 12 illustrate the top views of packages 100 in accordance with additional embodiments, wherein laser mark pad 128 is a large laser mark pad that occupies a significant area of package 100, wherein a laser mark pad 128 may have a plurality of laser marks 32 formed thereon. As shown in FIG. 11, the large laser mark pad 128 may be a solid metal pad in these embodiments. In the embodiments as shown in FIG. 12, there is again a single laser mark pad 128, with a plurality of slots 146 formed in laser mark pad 128. Slots 146 penetrate through laser mark pad 128. The plurality of slots 146 help reduce the stress in package 100, wherein the stress is generated due to the difference between the Coefficients of Thermal Expansion (CTEs) of laser mark pad 128 and the surrounding dielectric materials 118, 131, and 140. The embodiments in FIGS. 11 and 12 have the advantageous feature of good thermal dissipation in the laser marking due to the large area of laser mark pad 128.

The area of laser mark pad 128 and slots 146 may be adjusted so that the metal density in the metal layer of laser mark pad 128 is not overly high. The metal density is the ratio of the total area of all metal features (including RDLs 116 and laser mark pads 128) divided by the area of package 100. In some exemplary embodiments, the metal density is controlled to be lower than about 50 percent.

The embodiments of the present disclosure have several advantageous features. By forming the laser mark pads, the depth of the laser marking is controlled by the laser mark pads. The device dies and the redistribution lines in the packages are protected from the likely damage caused by the laser marking. The embodiments of the present disclosure do not incur additional manufacturing costs since the laser mar pads may be formed at the same time the redistribution lines of the package are formed.

In accordance with some embodiments of the present disclosure, a package includes a device die, a molding material molding the device die therein, and a plurality of redistribution lines overlying the device die and the molding material. A laser mark pad is coplanar with one of the plurality of redistribution lines, wherein the laser mark pad and the one of the plurality of redistribution layers are formed of the same conductive material. A tape is attached over the polymer layer. A laser mark penetrates through the tape and the polymer layer. The laser mark extends to a top surface of the laser mark pad.

In accordance with alternative embodiments of the present disclosure, a package includes a first package including at least one first dielectric layer, a first plurality of redistribution lines in the at least one first dielectric layer, a device die over and electrically coupled to the first plurality of redistribution lines, a molding material molding the device die therein, a through-via penetrating through the molding material, at least one second dielectric layer over the device die, and a second plurality of redistribution lines in the at least one second dielectric layer. One of the second plurality of redistribution lines is electrically coupled to one of the first plurality of redistribution lines through the through-via. The package further includes a metal pad is in the at least one second dielectric layer, wherein the metal pad is connected to the through-via, a third dielectric layer overlying the at least one second dielectric layer, a laser mark extending from a top surface of the third dielectric layer to a top surface of the metal pad, and a second package over and bonded to the first package.

In accordance with yet alternative embodiments of the present disclosure, a method includes forming a package, which includes at least one first dielectric layer, a first plurality of redistribution lines in the at least one first dielectric layer, a device die over and electrically coupled to the first plurality of redistribution lines, a molding material molding the device die therein, a through-via penetrating through the molding material, at least one second dielectric layer over the device die, a second plurality of redistribution lines in the at least one second dielectric layer, wherein the second plurality of redistribution lines is electrically coupled to the first plurality of redistribution lines through the through-via, and a metal pad in the at least one second dielectric layer. A polymer layer is formed overlying the at least one second dielectric layer, a tape is attached over the polymer layer. The method further includes performing a laser marking to form a laser mark in the polymer layer and the tape, with portions of the metal pad exposed to the laser mark.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first package comprising:
        at least one first dielectric layer;
        a first plurality of redistribution lines in the at least one first dielectric layer;
        a device die over and electrically coupled to the first plurality of redistribution lines;
        an encapsulating material encapsulating the device die;
        a through-via penetrating through the encapsulating material;
        at least one second dielectric layer over the device die;
        a second plurality of redistribution lines in the at least one second dielectric layer, wherein one of the second plurality of redistribution lines is electrically coupled to one of the first plurality of redistribution lines through the through-via; and
        a metal pad in the at least one second dielectric layer;
    forming a polymer layer overlying the at least one second dielectric layer;
    attaching a tape over the polymer layer; and
    performing a laser marking to form a laser mark in the polymer layer and the tape, with portions of the metal pad exposed to the laser mark.

2. The method of claim 1, wherein the laser mark comprises a letter or a digit.

3. The method of claim 1 further comprising:
    forming openings in the polymer layer and the tape to expose a plurality of metal pads; and
    forming solder regions extending into the openings to join to the plurality of metal pads.

4. The method of claim 1 further comprising bonding a second package to the first package, wherein the second package overlaps the laser mark.

5. The method of claim 4 further comprising filling an underfill into a gap between the first package and the second package, wherein the underfill is disposed into the laser mark.

6. The method of claim 5, wherein the underfill physically contacts the metal pad.

7. The method of claim 1, wherein the metal pad stops a laser beam used in the laser marking.

8. The method of claim 1, wherein the metal pad is electrically connected to the through-via.

9. A method comprising:
    forming a first package comprising:
        a device die;
        an encapsulating material encapsulating the device die;
        a first dielectric layer over the device die and the encapsulating material;
        a first redistribution line and a metal pad over the first dielectric layer; and
        a second dielectric layer over the first redistribution line and the metal pad;
    attaching a tape over the second dielectric layer; and
    using a laser beam to form a laser mark penetrating through the second dielectric layer and the tape, wherein the laser beam stops on the metal pad, and the laser mark has a pattern of a letter or a digit.

10. The method of claim 9 further comprising attaching the device die to the first dielectric layer through a die-attach film, wherein metal pad overlaps the die-attach film.

11. The method of claim 9, wherein the encapsulating material further encapsulates a first metal post, and the first redistribution line connects the metal pad to the first metal post.

12. The method of claim 11, wherein the encapsulating material further encapsulates a second metal post, and the metal pad is connected to the second metal post through an additional metal pad over the first dielectric layer.

13. The method of claim 12 further comprising:
    forming a plurality of metal pads electrically connected through a plurality of redistribution lines, wherein the plurality of metal pads is electrically connected in series; and
    forming an additional laser mark over each of the plurality of metal pads.

14. The method of claim 9 further comprising:
    bonding a second package to the first package; and
    filling an underfill into a gap between the first package and the second package, wherein the underfill is disposed into the laser mark.

15. A method comprising:
    forming a first package comprising:
        encapsulating a device die and a first metal post in an encapsulating material;
        forming a first dielectric layer over the device die and the encapsulating material;
        forming a plurality of redistribution lines over the first dielectric layer, wherein portions of the plurality of redistribution lines are electrically coupled to the device die;
        forming a metal pad over the first dielectric layer, wherein the metal pad is electrically coupled to the first metal post; and
        disposing a second dielectric layer over the plurality of redistribution lines and the metal pad;
    using a laser beam to form a laser mark as an opening penetrating through the second dielectric layer, wherein the laser beam stops on the metal pad, and the laser mark has a pattern of a letter or a digit; and
    filling the opening with a dielectric material.

16. The method of claim 15, wherein the filling the opening with the dielectric material comprises filling an underfill.

17. The method of claim 16 further comprising bonding a second package to the first package, wherein the underfill is filled into a gap between the first package and the second package.

18. The method of claim 15 further comprising encapsulating a second metal post in the encapsulating material, wherein the metal pad is electrically connected to both the first metal post and the second metal post by redistribution lines.

19. The method of claim 18, wherein the metal pad is coupled between the first metal post and the second metal post.

20. The method of claim 15 further comprising electrically grounding the metal pad and the first metal post.

* * * * *